United States Patent
Shibata

(10) Patent No.: US 11,961,921 B2
(45) Date of Patent: Apr. 16, 2024

(54) SEMICONDUCTOR DEVICE AND MANUFACTURING METHOD FOR SEMICONDUCTOR DEVICE

(71) Applicant: LAPIS Semiconductor Co., Ltd., Yokohama (JP)

(72) Inventor: Hiroshi Shibata, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 244 days.

(21) Appl. No.: 17/401,484

(22) Filed: Aug. 13, 2021

(65) Prior Publication Data

US 2022/0069140 A1  Mar. 3, 2022

(30) Foreign Application Priority Data

Aug. 25, 2020 (JP) ................. 2020-141463

(51) Int. Cl.
*H01L 29/92* (2006.01)
*H01L 29/66* (2006.01)
*H01L 29/94* (2006.01)

(52) U.S. Cl.
CPC ...... *H01L 29/945* (2013.01); *H01L 29/66181* (2013.01)

(58) Field of Classification Search
CPC . H01L 29/945; H01L 29/66181–66189; H01L 28/40–92; H01L 27/0805; H01L 27/0808; H01L 27/0811
See application file for complete search history.

(56) References Cited

U.S. PATENT DOCUMENTS

| | | | | |
|---|---|---|---|---|
| 4,855,952 A * | 8/1989 | Kiyosumi | ......... | H01L 21/76264 257/E21.651 |
| 4,977,104 A * | 12/1990 | Sawada | ............. | H01L 29/66181 438/386 |
| 5,343,062 A * | 8/1994 | Tomioka | ................. | H01L 28/75 257/296 |
| 6,803,640 B1 * | 10/2004 | Lee | ......................... | H01L 25/16 257/532 |
| 2012/0181656 A1 * | 7/2012 | Lehnert | ................ | H10B 12/038 257/532 |
| 2019/0229181 A1 * | 7/2019 | Jia | ..................... | H01L 21/32134 |

FOREIGN PATENT DOCUMENTS

JP 2005-142549 A 6/2005
JP 2009-141307 A 6/2009

* cited by examiner

*Primary Examiner* — Eric A. Ward
(74) *Attorney, Agent, or Firm* — Rabin & Berdo, P.C.

(57) ABSTRACT

A semiconductor device has a semiconductor substrate and a semiconductor film doped with impurities that is formed so as to cover an inner wall surface of a trench formed so as to extend from a first surface of the semiconductor substrate towards an interior thereof. The semiconductor film is formed so as to extend continuously from the inner wall surface to the first surface of the semiconductor substrate. The semiconductor device further has an opposite electrode having a first portion that is provided at a position opposing the semiconductor substrate while sandwiching the semiconductor film therebetween, and that extends on the first surface of the semiconductor substrate, and a second portion that is continuous with the first portion and extends so as to fill the trench. The semiconductor device further has an insulating film that insulates the semiconductor film from the opposite electrode.

7 Claims, 7 Drawing Sheets

SEMICONDUCTOR DEVICE AND MANUFACTURING METHOD FOR SEMICONDUCTOR DEVICE

CROSS REFERENCE TO RELATED APPLICATION

This application is based upon and claims the benefit of priority of the prior Japanese Patent Application No. 2020-141463, filed on Aug. 25, 2020, the entire contents of which are incorporated herein by reference.

TECHNICAL FIELD

The present invention relates to a semiconductor device and a manufacturing method for a semiconductor device.

BACKGROUND ART

In improving semiconductor manufacturing techniques, there has been progress towards increased density whereby more and higher performance elements are installed per unit area of a circuit (unit information projected area). Regarding capacitor elements used in a semiconductor memory or the like, a method is known in which a trench is formed in the semiconductor substrate to increase the surface area by forming a 3-dimensional structure and increase the capacitance density per unit area (e.g., Japanese Patent Application Laid-Open Publication No. 2009-141307, Japanese Patent Application Laid-Open Publication No. 2005-142549).

SUMMARY OF THE INVENTION

In general, dry etching is used to form a trench in a semiconductor substrate. In dry etching, efforts are made to make the side wall of the trench as smooth as possible. However, the surface of the side wall is not necessarily perfectly smooth, and minute recesses and protrusions that are recognized as surface roughness sometimes appear.

If a capacitor insulating film constituting the trench capacitor were directly formed on the side wall of the trench where such minute recesses and protrusions are formed, then due to the deposition characteristics of the insulating film, thinning occurs in the capacitor insulating film in acute angle sections of the minute recesses and protrusions. Thinning of the capacitor insulating film results in a decrease in breakdown voltage thereof. Also, if a voltage is applied to the opposite electrode during operation of the device, an electric field is concentrated in the portions of the minute recesses and protrusions with acute angles. The concentration of the electric field is also a factor leading to reduction in the breakdown voltage of the capacitor insulating film.

Also, if a trench capacitor were formed as is in a low impurity concentration region of the semiconductor substrate in the manner of the conventional technique, this results in the property that the capacitance thereof changes depending on the voltage applied to the opposite electrode (C-V characteristics of a so-called MOS capacitor). In order to prevent the occurrence of this property, formation of a high impurity concentration region through ion implantation or the like in the periphery of the region where the trench capacitor is formed and formation of a high impurity concentration region in the side wall and bottom of the trench in the vicinity of the surface through oblique rotating ion implantation have been in practice. However, the problem with using such methods is that implementation thereof has become increasingly difficult as the aspect ratio of the trench increases due to miniaturization of the trench capacitor, narrowing of the opening, increasing of the depth of the trench, and the like.

The present invention takes into consideration these problems, and an object thereof is to provide a semiconductor device that can mitigate a fluctuation in capacitance of the trench capacitor according to the applied voltage while mitigating a reduction in the breakdown voltage of the capacitor insulating film.

A semiconductor device according to the present invention includes: a semiconductor substrate; a semiconductor film doped with impurities that is formed so as to cover an inner wall surface of a trench formed so as to extend from a first surface of the semiconductor substrate towards an interior thereof, and so as to extend continuously from the inner wall surface to the first surface of the semiconductor substrate; an opposite electrode having a first portion that is provided at a position opposing the semiconductor substrate while sandwiching the semiconductor film therebetween, and that extends on the first surface of the semiconductor substrate, and a second portion that is continuous with the first portion and extends so as to fill the trench; and an insulating film that insulates the semiconductor film from the opposite electrode.

Also, a manufacturing method for a semiconductor device according to the present invention includes: a step of forming a trench that extends towards an interior of a semiconductor substrate from a first surface of the semiconductor substrate through dry etching; a step of forming a semiconductor film doped with impurities so as to cover an inner wall surface of the trench, and continuously extend from the inner wall surface to the first surface of the semiconductor substrate; a step of forming an insulating film on a surface of the semiconductor film; and a step of forming, on the insulating film, an opposite electrode having a first portion that extends on the first surface of the semiconductor substrate and a second portion that is continuous with the first portion and extends so as to fill the trench.

According to the semiconductor device of the present invention, it is possible to suppress a reduction in breakdown voltage of the capacitor insulating film while mitigating fluctuation in the capacitance of the trench capacitor according to the applied voltage.

DETAILED DESCRIPTION OF EMBODIMENTS

Figure 1:
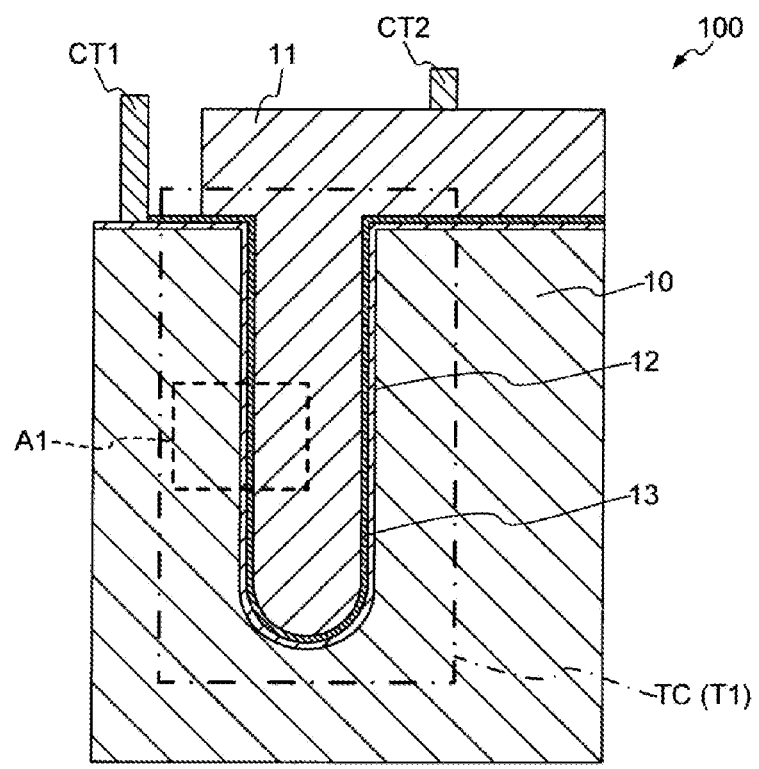
FIG. 1 is a cross-sectional view showing a structure of a semiconductor device according to Embodiment 1 of the present invention.

Suitable embodiments of the present invention will be explained below in detail. In the description of embodiments and the affixed drawings below, parts that are substantially the same or equivalent to each other are assigned the same reference characters.

Embodiment 1

FIG. 1 is a cross-sectional view showing the configuration of a semiconductor device 100 according to Embodiment 1 of the present invention. The semiconductor device 100 includes a semiconductor substrate 10 and an opposite electrode 11. The semiconductor substrate 10 has formed therein a trench capacitor TC.

The semiconductor substrate 10 is a silicon (Si) substrate, for example. The surface of the semiconductor substrate 10 on which elements are installed (hereinafter referred to as the first surface) has formed thereon a polysilicon film 12 and a capacitor insulating film 13.

The first surface of the semiconductor substrate 10 has formed therein a trench-type recess (hereinafter referred to as a trench T1) that extends towards the interior. The trench T1 is constituted of the trench capacitor TC together with the polysilicon film 12 and the capacitor insulating film 13 formed on the surface thereof.

The trench T1 is formed by performing trench processing through dry etching of the semiconductor substrate 10. The surface of the side wall of the trench T1 has formed thereon minute recesses/protrusions. These minute recesses/protrusions are irregular recesses/protrusions that are formed at a level recognizable as so-called surface roughness, and have shapes with acute angles. In the description below, such minute recesses/protrusions are referred to as micro-recesses/protrusions.

The opposite electrode 11 is made of polysilicon (poly-Si). The opposite electrode 11 is formed so as to oppose the semiconductor substrate 10 across the capacitor insulating film 13 and the polysilicon film 12. The opposite electrode 11 has a flat portion (first portion) formed so as to extend on the first surface of the semiconductor substrate 10, and a portion (second portion) that extends towards the interior of the semiconductor substrate 10 so as to be continuous with the flat portion while filling the trench of the semiconductor substrate 10.

The polysilicon film 12 is a semiconductor film that is formed so as to cover the interior surface (in particular, the side wall surface) of the trench T1 and so as to extend on the first surface of the semiconductor substrate 10. In the present embodiment, the polysilicon film 12 is a polysilicon film that has been doped with impurities (doped poly-Si). The polysilicon film 12 is formed by depositing polysilicon through LP-CVD (that is, low pressure chemical vapor deposition) on the surface of the semiconductor substrate 10 including the inner wall of the trench T1. In the present embodiment, the polysilicon film 12 is formed as a polysilicon film doped with impurities (doped polysilicon film) by introducing, into the source gas, impurities for increasing conductivity while depositing a polysilicon film through LP-CVD.

The capacitor insulating film 13 is an insulating film provided between the opposite electrode 11 and the polysilicon film 12. The capacitor insulating film 13 is formed on the surface of the polysilicon film 12 so as to cover the interior surface of the trench T1 and so as to extend on the first surface of the semiconductor substrate 10. The capacitor insulating film 13 is an insulating film such as a silicon nitride (SiN) film, for example, and is formed by directly depositing SiN through LP-CVD, for example, onto the surface of the polysilicon film 12.

A contact CT1 is provided on the first surface of the semiconductor substrate 10. The contact CT1 is a substrate-side contact to which a voltage is applied, and is connected to the semiconductor substrate 10 via the polysilicon film 12.

A contact CT2 is provided on the surface of the flat portion of the opposite electrode 11 (the surface opposite to that facing the semiconductor substrate 10). The contact CT2 is an electrode-side contact to which a voltage is applied, and is connected to the opposite electrode 11. The contacts CT1 and CT2 are made of a conductor such as tungsten, for example.

Figure 2:
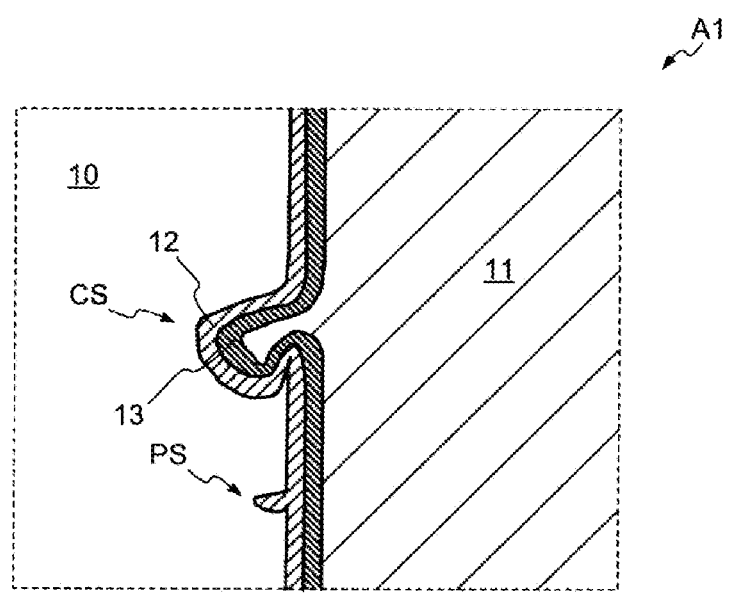
FIG. 2 is an enlarged view of the section of FIG. 1 surrounded by the broken line.

FIG. 2 is an enlarged view of the section A1 of FIG. 1 surrounded by the broken line. Here, the shading of the semiconductor substrate 10 is omitted.

As described above, the side wall of the trench T1, formed by dry etching, has formed thereon micro-recesses/protrusions. As shown in FIG. 2, for example, the micro-recesses/protrusions include a recessed portion (referred to as a recessed shape CS) that is a portion of the side wall surface of the trench T1 that is recessed towards the semiconductor substrate 10 and a pointed section (referred to as a pointed shape PS). In the present embodiment, the recessed shape CS has a given size that is greater than the thickness of the polysilicon film 12 and the capacitor insulating film 13. The pointed shape PS has a size that is less than the thickness of the polysilicon film 12.

The polysilicon film 12 is formed so as to cover the side wall surface of the trench T1 following the shape of the micro-recesses/protrusions, as a result of the deposition characteristics of LP-CVD. In the recessed shape CS, for example, the polysilicon film 12 is formed along the recess/protrusion shape, and the capacitor insulating film 13 is formed on the polysilicon film 12. Meanwhile, in the case of the pointed shape PS, the polysilicon film 12 is formed so as to fill in the recess of the pointed shape that is recessed towards the semiconductor substrate 10. As a result, the surface of the side wall portion of the trench T1 is smoothed.

Figure 3:
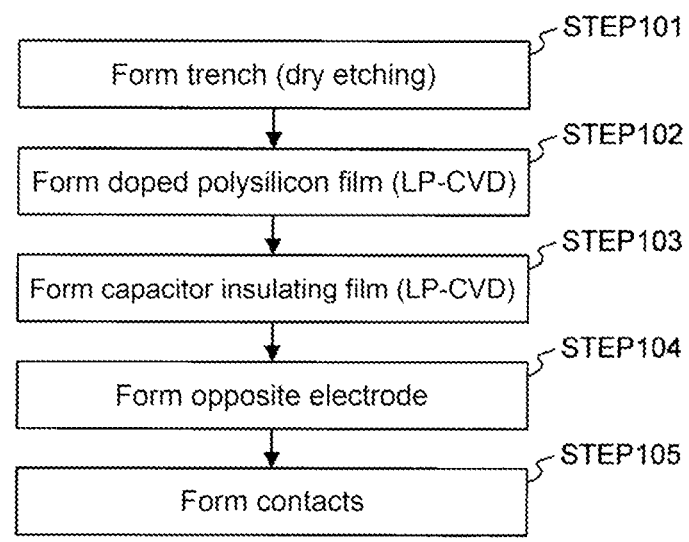
FIG. 3 is a flowchart showing manufacturing steps for the semiconductor device according to Embodiment 1.

Next, a manufacturing method for the semiconductor device 100 of the present embodiment will be described with reference to the flowchart of FIG. 3.

First, dry etching is performed on the semiconductor substrate 10 to form a trench (STEP 101). As a result, the trench T1 is formed.

Next, through LP-CVD, polysilicon is deposited through LP-CVD while introducing impurities thereto on the surface of the semiconductor substrate 10 including the inner wall of the trench (STEP 102). As a result, the polysilicon film 12, which is a polysilicon film doped with impurities, is formed.

Next, through LP-CVD, a silicon nitride film (SiN) is formed on the surface of the polysilicon film 12 (STEP 103). At this time, the silicon nitride film is formed upon performing patterning such that a portion of the polysilicon film 12 at the location where the contact CT1 is to be formed is exposed at the wafer surface. As a result, the capacitor insulating film 13 is formed.

Next, a polysilicon layer is formed on the surface of the capacitor insulating film 13 so as to fill the interior of the trench T1 and so as to extend on the first surface of the semiconductor substrate 10. As a result, the opposite electrode 11 made of polysilicon is formed (STEP 104).

Next, contact holes are formed in the surface of the polysilicon film 12 and the surface of the opposite electrode 11 that are exposed at the wafer surface, and the contact holes are filled by a conductor such as tungsten. As a result, the contacts CT1 and CT2 are formed (STEP 105).

Through these steps, the semiconductor device 100 of the present embodiment is produced.

In the semiconductor device 100 of the present embodiment, the polysilicon film 12 is formed on the surface of the side wall portion of the trench T1, and the capacitor insulating film 13 is formed on the polysilicon film 12. Thus, in the semiconductor device 100 of the present embodiment, the breakdown voltage of the capacitor insulating film 13 in the trench capacitor TC is higher compared to a case in which a similar polysilicon film is not formed.

If a polysilicon film were not formed, and the capacitor insulating film were directly formed on the side wall surface of the trench, the capacitor insulating film would undergo partial thinning in the acute-angled portion (e.g., vicinity of the tip of the bent portion of the recessed shape CS shown in FIG. 2) of the micro-recess/protrusion on the side wall surface of the trench. Also, if a voltage is applied to the opposite electrode via a contact, an electric field is concentrated in the portions of the micro-recess/protrusion with acute angles. If the polysilicon film of the present embodiment were not formed, then as a result of the partial thinning of the capacitor insulating film and the concentration of the electric field in the acute angle portions when applying a voltage, the breakdown voltage of the capacitor insulating film would be reduced.

By contrast, in the semiconductor device 100 of the present embodiment, the polysilicon film 12 is formed so as to cover the acute angle sections of the recessed shape CS of the micro-recess/protrusion of the trench T1. The pointed shape PS of the micro-recess/protrusion is thinner than the polysilicon film 12, and thus, is embedded in and smoothed by the polysilicon film 12.

The capacitor insulating film 13 is formed on the surface of this polysilicon film 12, and is not directly formed on the side wall surface of the trench T1. As a result, no partial thinning occurs in the capacitor insulating film 13, and no concentration of the electric field occurs when a voltage is applied.

Also, in the present embodiment, the capacitor insulating film 13 is formed on the surface of polysilicon film 12 doped with impurities. If, unlike the present embodiment, a non-doped polysilicon film were used instead of the polysilicon film 12, this would result in a property in which, when applying a voltage to the opposite electrode 11, the capacitance of the trench capacitor fluctuates according to the applied voltage (C-V characteristics of so-called MOS capacitor).

However, in the semiconductor device 100 of the present embodiment, the polysilicon film 12, which is doped with impurities, is used instead of the non-doped polysilicon film, and thus, when a voltage is applied to the opposite electrode 11, the trench capacitor TC operates as a MOS capacitor to store charge regardless of the applied voltage. In other words, in the trench capacitor TC of the present embodiment, a generally constant capacitance can be attained regardless of the voltage applied to the opposite electrode 11.

As described above, according to the semiconductor device 100 of the present embodiment, thinning of the capacitor insulating film 13 and reduction in the breakdown voltage of the capacitor insulating film 13 resulting from the concentration of the electric field during application of a voltage do not occur. According to the semiconductor device 100 of the present embodiment, there is no fluctuation in the capacitance of the trench capacitor TC according to the applied voltage.

Therefore, according to the semiconductor device 100 of the present embodiment, it is possible to suppress a reduction in breakdown voltage of the capacitor insulating film while mitigating fluctuation in the capacitance of the trench capacitor according to the applied voltage.

Embodiment 2

Figure 4:
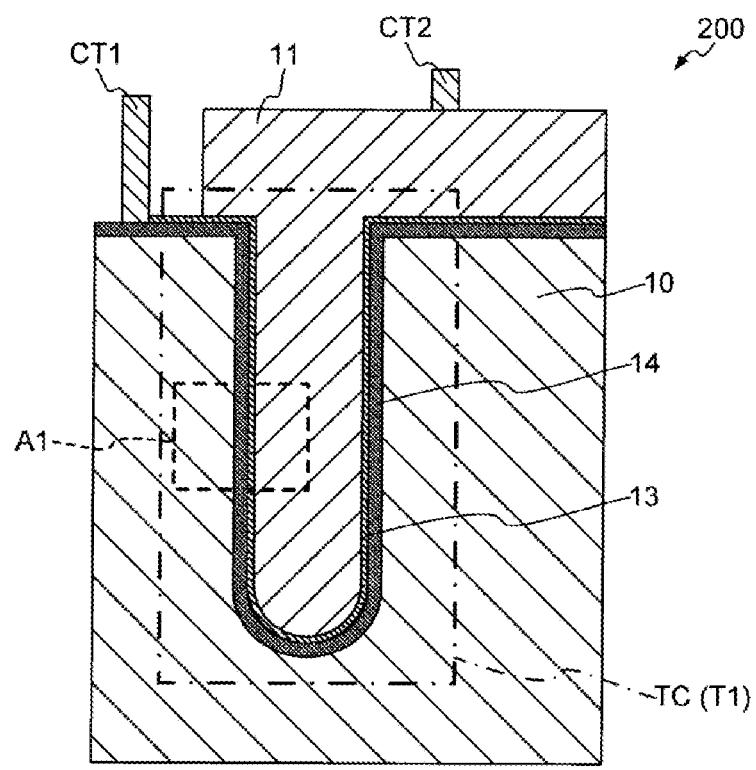
FIG. 4 is a cross-sectional view showing a structure of a trench capacitor according to Embodiment 2 of the present invention.

Next, Embodiment 2 of the present invention will be explained. FIG. 4 is a cross-sectional view showing the configuration of a semiconductor device 200 according to Embodiment 2 of the present invention.

In the semiconductor device 200 of the present embodiment, a polysilicon film 14 is formed by sequentially forming, on the surface of the semiconductor substrate 10 including the side wall of the trench T1, a first polysilicon film that has been doped with impurities and a non-doped second polysilicon film, and performing thermal annealing thereon to cause the impurities in the first polysilicon film to undergo solid-phase diffusion to the second polysilicon film. As a result, the polysilicon film 14 according to the present embodiment is formed to be thicker than the polysilicon film 12 of Embodiment 1 (approximately double the thickness, for example).

Figure 5:
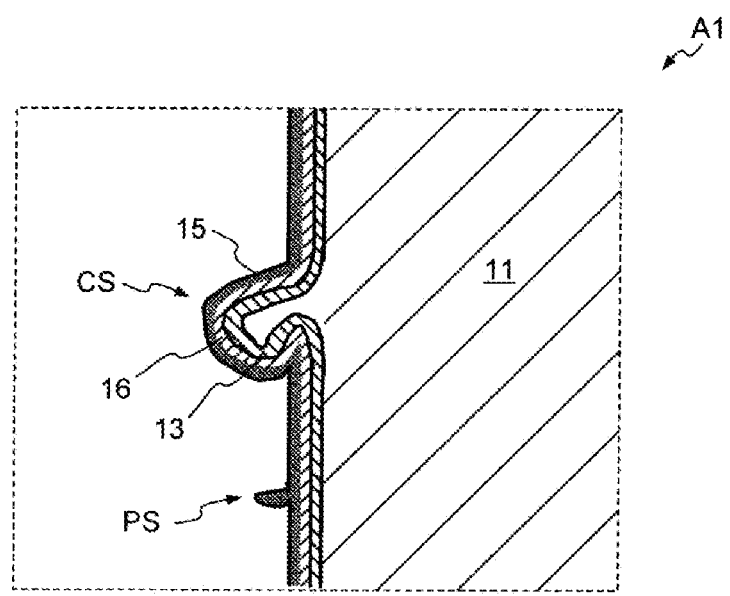
FIG. 5 is a cross-sectional view showing a section of a surface during the formation step for a capacitor insulating film of a trench capacitor according to Embodiment 2 of the present invention.

FIG. 5 is an enlarged cross-sectional view of a section of the trench T1 (the section A1 of FIG. 4 surrounded by the broken line) in the state prior to thermal annealing being performed.

A first polysilicon film 15 doped with impurities is formed on the surface of the semiconductor substrate 10 in the interior of the trench. Additionally, a second polysilicon film 16, which is the non-doped polysilicon film, is formed on the surface of the first polysilicon film 15, and the capacitor insulating film 13 is formed on the second polysilicon film 16.

Figure 6:
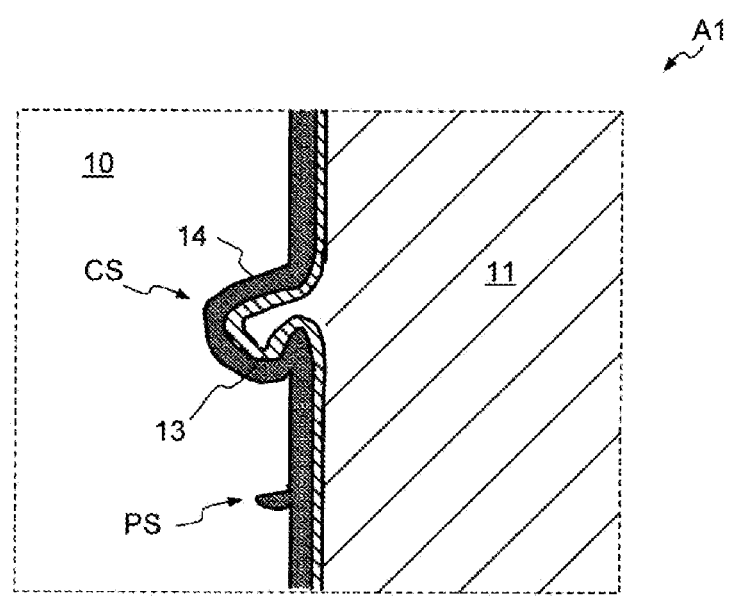
FIG. 6 is a cross-sectional view showing a section of a surface of the trench capacitor that has been thermally annealed according to Embodiment 2 of the present invention.

FIG. 6 is an enlarged cross-sectional view of the section of the trench T1 (the section A1 of FIG. 4 surrounded by the broken line) in the state after thermal annealing was performed.

Thermal annealing of the structure shown in FIG. 5 causes the impurities in the first polysilicon film 15 to undergo solid-phase diffusion to the second polysilicon film 16, and the entire two-layer film constituted of the non-doped polysilicon and the doped polysilicon becomes doped polysilicon. Thus, as shown in FIG. 6, the polysilicon film 14 doped with impurities is formed to a thickness of two layers on the surface of the semiconductor substrate 10 and the capacitor insulating film 13 is formed on the surface of the polysilicon film 14.

Figure 7:
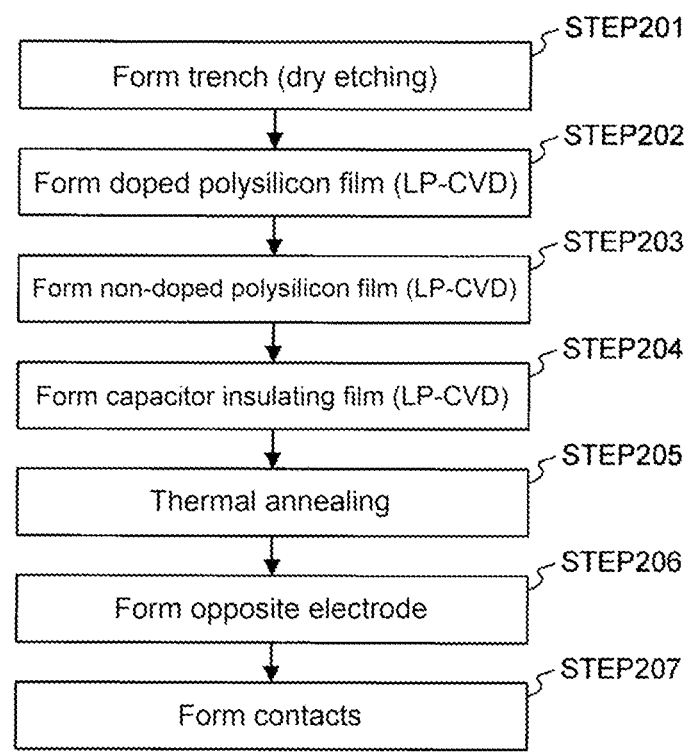
FIG. 7 is a flowchart showing manufacturing steps for the semiconductor device according to Embodiment 2.

Next, a manufacturing method for the semiconductor device 200 of the present embodiment will be described with reference to the flowchart of FIG. 7.

First, dry etching is performed on the semiconductor substrate 10 to form a trench (STEP 201). As a result, the trench T1 is formed.

Next, through LP-CVD, polysilicon is deposited through LP-CVD while introducing impurities thereto on the surface of the semiconductor substrate 10 including the inner wall of the trench (STEP 202). As a result, the first polysilicon film 15, which is a polysilicon film doped with impurities, is formed.

Next, through LP-CVD, polysilicon is deposited on the surface of the first polysilicon film 15 (STEP 203). In this case, unlike STEP 202, no impurities are introduced. As a result, the second polysilicon film 16, which is a non-doped polysilicon film, is formed.

Next, through LP-CVD, a silicon nitride film (SiN) is formed on the surface of the second polysilicon film 16 (STEP 204). As a result, the capacitor insulating film 13 is formed.

Next, thermal annealing is performed on the semiconductor substrate 10, the surface of which has formed sequentially thereon the first polysilicon film 15 doped with impurities, the non-doped second polysilicon film 16, and the capacitor insulating film 13 (STEP 205). As a result, the impurities in the first polysilicon film 15 undergo solid-phase diffusion to the second polysilicon film 16, resulting in both the first polysilicon film 15 and the second polysilicon film 16 being doped with the impurities. In other words, the entire two-layer film constituted of the non-doped polysilicon and the doped polysilicon (polysilicon doped with impurities) becomes doped polysilicon, forming the polysilicon film 14.

Next, a polysilicon layer is formed on the surface of the capacitor insulating film 13 so as to fill the interior of the trench T11 and so as to extend on the first surface of the semiconductor substrate 10. As a result, the opposite electrode 11 made of polysilicon is formed (STEP 206).

Next, contact holes are formed in the surface of the polysilicon film 14 and the surface of the opposite electrode 11 that are exposed at the wafer surface, and the contact holes are filled by a conductor such as tungsten. As a result, the contacts CT1 and CT2 are formed (STEP 207).

Through these steps, the semiconductor device 200 of the present embodiment is produced.

In the present embodiment, the first polysilicon film 15 doped with impurities and the non-doped second polysilicon film 16 are sequentially formed, and the capacitor insulating film 13 is formed on the surface of the non-doped polysilicon film 16. Thereafter, thermal annealing is performed so as to form a polysilicon film in which the entire two-layer polysilicon film is doped with impurities. In other words, at the stage of forming the capacitor insulating film 13, the surface therebelow is still the non-doped second polysilicon film 16.

If, unlike the present embodiment, the capacitor insulating film were directly formed on the surface of a polysilicon film doped with impurities, deposition characteristics for the capacitor insulating film could be affected in localized areas where impurity atoms emerge at the surface of the polysilicon film. As a result, in some cases, the film characteristics of the capacitor insulating film could be degraded, resulting in a reduced breakdown voltage.

However, according to the manufacturing method of the present embodiment, when forming the capacitor insulating film 13, the surface therebelow is the non-doped second polysilicon film 16, and thus, no impurity atoms emerge from said surface. Thus, it is possible to avoid a degradation of film characteristics of the capacitor insulating film 13 resulting from impurity atoms.

Also, in the present embodiment, the non-doped second polysilicon film 16 is changed to the polysilicon film 14 that has been doped with impurities by thermal annealing. If thermal annealing were not performed and a state were maintained in which the capacitor insulating film 13 is formed on the non-doped polysilicon film, this would result in a property in which, when applying a voltage to the opposite electrode 11, the capacitance fluctuates according to the applied voltage (C-V characteristics of so-called MOS capacitor).

However, in the semiconductor device 200 of the present embodiment, the non-doped second polysilicon film 16 is changed to the polysilicon film 14 that has been doped with impurities by thermal annealing. Thus, when a voltage is applied to the opposite electrode 11, the trench capacitor TC operates as a MOS capacitor to store charge regardless of the applied voltage. In other words, in the trench capacitor TC of the present embodiment, a generally constant capacitance can be attained regardless of the voltage applied to the opposite electrode 11.

The present invention is not limited to the embodiments above. In the embodiments above, examples were described in which the opposite electrode 11 is formed using polysilicon. However, the present invention is not limited thereto, and the opposite electrode 11 may be made of a conductive layer constituted of another conductive material other than polysilicon.

In the embodiments above, examples were described in which polysilicon films are used as semiconductor films that cover the acute-angled portions of the recess/protrusion structure of the trench. However, the present invention is not limited thereto, and semiconductor films other than polysilicon films may be used.

Also, in the embodiments above, a case in which the trench is formed by dry etching has been described as an example, but there is no particular limitation on the specific method used for dry etching. The trench may, for example, be formed using the Bosch etching technique.

What is claimed is:

1. A semiconductor device, comprising:
    a semiconductor substrate;
    a semiconductor film doped with impurities that is formed so as to cover an inner wall surface of a trench formed so as to extend from a first surface of the semiconductor substrate towards an interior of the semiconductor substrate, and so as to extend continuously from the inner wall surface to the first surface of the semiconductor substrate;
    an opposite electrode having a first portion that is provided at a position opposing the semiconductor substrate while sandwiching the semiconductor film between the opposite electrode and the semiconductor substrate, and that extends on the first surface of the semiconductor substrate, and a second portion that is continuous with the first portion and extends so as to fill the trench; and
    an insulating film that insulates the semiconductor film from the opposite electrode;
    wherein the semiconductor film is formed by performing thermal annealing on a structure in which a first polysilicon film doped with impurities and a non-doped second polysilicon film are sequentially formed on the inner wall surface of the trench, between the inner wall surface and the insulating film.

2. The semiconductor device according to claim 1, wherein the semiconductor film is a polysilicon film formed through low pressure chemical vapor deposition.

3. The semiconductor device according to claim 1, wherein the trench is formed by dry etching.

4. A manufacturing method for a semiconductor device, comprising:
    a step of forming a trench that extends towards an interior of a semiconductor substrate from a first surface of the semiconductor substrate through dry etching;
    a step of forming a semiconductor film doped with impurities so as to cover an inner wall surface of the trench, and continuously extend from the inner wall surface to the first surface of the semiconductor substrate;

a step of forming an insulating film on a surface of the semiconductor film; and a step of forming, on the insulating film, an opposite electrode having a first portion that extends on the first surface of the semiconductor substrate and a second portion that is continuous with the first portion and extends so as to fill the trench;

wherein the step of forming the semiconductor film includes:

a first step of forming a first polysilicon film doped with impurities; and a second step of forming a non-doped second polysilicon film on a surface of the first polysilicon film; and wherein the first polysilicon film and the second polysilicon film are formed between the inner wall surface and the insulating film.

5. The manufacturing method for a semiconductor device according to claim 4, further comprising:

a step of performing thermal annealing after the step of forming the insulating film.

6. A semiconductor device, comprising:

a semiconductor substrate;

a semiconductor film doped with impurities that is formed so as to cover an inner wall surface of a trench formed so as to extend from a first surface of the semiconductor substrate towards an interior of the semiconductor substrate, and so as to extend continuously from the inner wall surface to the first surface of the semiconductor substrate;

an opposite electrode having a first portion that is provided at a position opposing the semiconductor substrate while sandwiching the semiconductor film between the opposite electrode and the semiconductor substrate, and that extends on the first surface of the semiconductor substrate, and a second portion that is continuous with the first portion and extends so as to fill the trench; and an insulating film that insulates the semiconductor film from the opposite electrode, wherein a first recessed portion is formed so as to be recessed towards the semiconductor substrate in the inner wall surface of the trench, and a first pointed portion including a portion of the semiconductor film, a portion of the opposite electrode and a portion of the insulating film are formed so as to correspond to the first recessed portion.

7. The semiconductor device according to claim 6, wherein a second recessed portion is formed so as to be recessed towards the semiconductor substrate in the inner wall surface of the trench, and a second pointed portion including a portion of the semiconductor film is formed so as to correspond to the second recessed portion.

* * * * *